US009219498B2

(12) United States Patent
Wuebbolt

(10) Patent No.: US 9,219,498 B2
(45) Date of Patent: Dec. 22, 2015

(54) METHOD AND DEVICE FOR ARITHMETIC ENCODING OR ARITHMETIC DECODING

(75) Inventor: Oliver Wuebbolt, Hannover (DE)

(73) Assignee: Thomson Licensing, Issy-les-Moulineaux (FR)

(*) Notice: Subject to any disclaimer, the term of this patent is extended or adjusted under 35 U.S.C. 154(b) by 538 days.

(21) Appl. No.: 13/500,106

(22) PCT Filed: Oct. 1, 2010

(86) PCT No.: PCT/EP2010/064644
§ 371 (c)(1),
(2), (4) Date: Apr. 4, 2012

(87) PCT Pub. No.: WO2011/042366
PCT Pub. Date: Apr. 14, 2011

(65) Prior Publication Data
US 2012/0195375 A1 Aug. 2, 2012

(30) Foreign Application Priority Data
Oct. 9, 2009 (EP) .................... 09305961

(51) Int. Cl.
*H04N 11/02* (2006.01)
*H03M 7/40* (2006.01)
(52) U.S. Cl.
CPC .................. *H03M 7/4006* (2013.01)
(58) Field of Classification Search
USPC ................................. 375/240.05
See application file for complete search history.

(56) References Cited

U.S. PATENT DOCUMENTS

| 5,298,896 | A | 3/1994 | Lei et al. |
| 6,349,284 | B1 | 2/2002 | Park |

(Continued)

FOREIGN PATENT DOCUMENTS

| CN | 1741394 | 3/2006 |
| EP | 1699137 | 9/2006 |

(Continued)

OTHER PUBLICATIONS

Neuendorf et al: "A Novel Scheme for Low Bitrate Unified Speech and Audio Coding-MPEG RMO", Audio Engineering Society Convention, Jan. 1, 2009, pp. 1-13.

(Continued)

*Primary Examiner* — Dave Czekaj
*Assistant Examiner* — Leron Beck
(74) *Attorney, Agent, or Firm* — Robert D. Shedd; Paul P. Kiel

(57) ABSTRACT

The invention proposes a method and a device for arithmetic encoding of a current spectral coefficient using preceding spectral coefficients. Said preceding spectral coefficients are already encoded and both, said preceding and current spectral coefficients, are comprised in one or more quantized spectra resulting from quantizing time-frequency—transform of video, audio or speech signal sample values. Said method comprises processing the preceding spectral coefficients, using the processed preceding spectral coefficients for determining a context class being one of at least two different context classes, using the determined context class and a mapping from the at least two different context classes to at least two different probability density functions for determining the probability density function, and arithmetic encoding the current spectral coefficient based on the determined probability density function wherein processing the preceding spectral coefficients comprises non-uniformly quantizing absolutes of the preceding spectral coefficients for use in determining of the context class.

16 Claims, 9 Drawing Sheets

(56) References Cited

U.S. PATENT DOCUMENTS

| | | | |
|---|---|---|---|
| 8,655,669 B2* | 2/2014 | Fuchs et al. ............... | 704/500 |
| 2005/0052295 A1 | 3/2005 | Bossen | |

FOREIGN PATENT DOCUMENTS

| | | |
|---|---|---|
| EP | 1921752 | 5/2008 |
| EP | 2077551 | 7/2009 |
| RU | 2093968 | 10/1997 |
| RU | 2185024 | 7/2002 |
| WO | W09705747 | 2/1997 |
| WO | WO2009086918 | 7/2009 |
| WO | WO2010003479 | 1/2010 |

OTHER PUBLICATIONS

Nikolaus et al: "Improved Quantization and Lossless Coding for Subband Audio Coding", AES Convention, vol. 1-4, May 31, 2005, pp. 1-9.

Neuendorf et al: "WD on Unified Speech and Audio Coding", Int'l Organization for Standarization, Oct. 2008, pp. 1-96.

Search Report Dated Mar. 25, 2011.

Meine et al., "Improved Quantization and Lossless Coding for Subband Audio Coding", AES Convention, vol. 1-4, May 31, 2005, pp. 1-9.

Neuendorf et al, "A Novel Scheme for Low Bitrate Unified Speech and Audio Coding-MPEG RMO", Audio Engineering Society Convention, Jan. 1, 2008, pp. 1-13.

Neuendorf et al "WD on Unified Speech and Audio Coding", Int'l Organization for Standardization, Oct. 2008, pp. 1-96.

Meine, Nicholas, Dissertation: Vector and Context Sensitive Arithmetic Encoding for MPEG-4 AAC; The Gottfried Wilhelm Leibniz University, Hannover Germany, Jun. 26, 2007, Abstract in English.

Neurendorf: N10847, ISO/IEC JTC1/SC29/WG11, WD4 of USAC, Jul. 2009, London, UK.

Oger Etal, Model-based deadzone optimization for stack-run audio coding with uniform scalar quantization, ICASSP 2008, IEEE International Conference on Aucoustic, Speech and Sigan Prosesses, 4761-4764. IEEE, Mar. 31-Apr. 4, 2008, Las Vegas, NV, USA.

Meine Nicolaus,"Vector quantization and context sensitive arithmetic coding for MPEG-4 AAC", Dissertation approved by the Faculty of Electrical Engineering and Computing Science of the Gottfried Wilhelm Leibnis University Hannover, Germany, in fulfillment of the requirements for Doctorate in Engineering, Jun. 26, 2007, Hannover, Germany.

\* cited by examiner

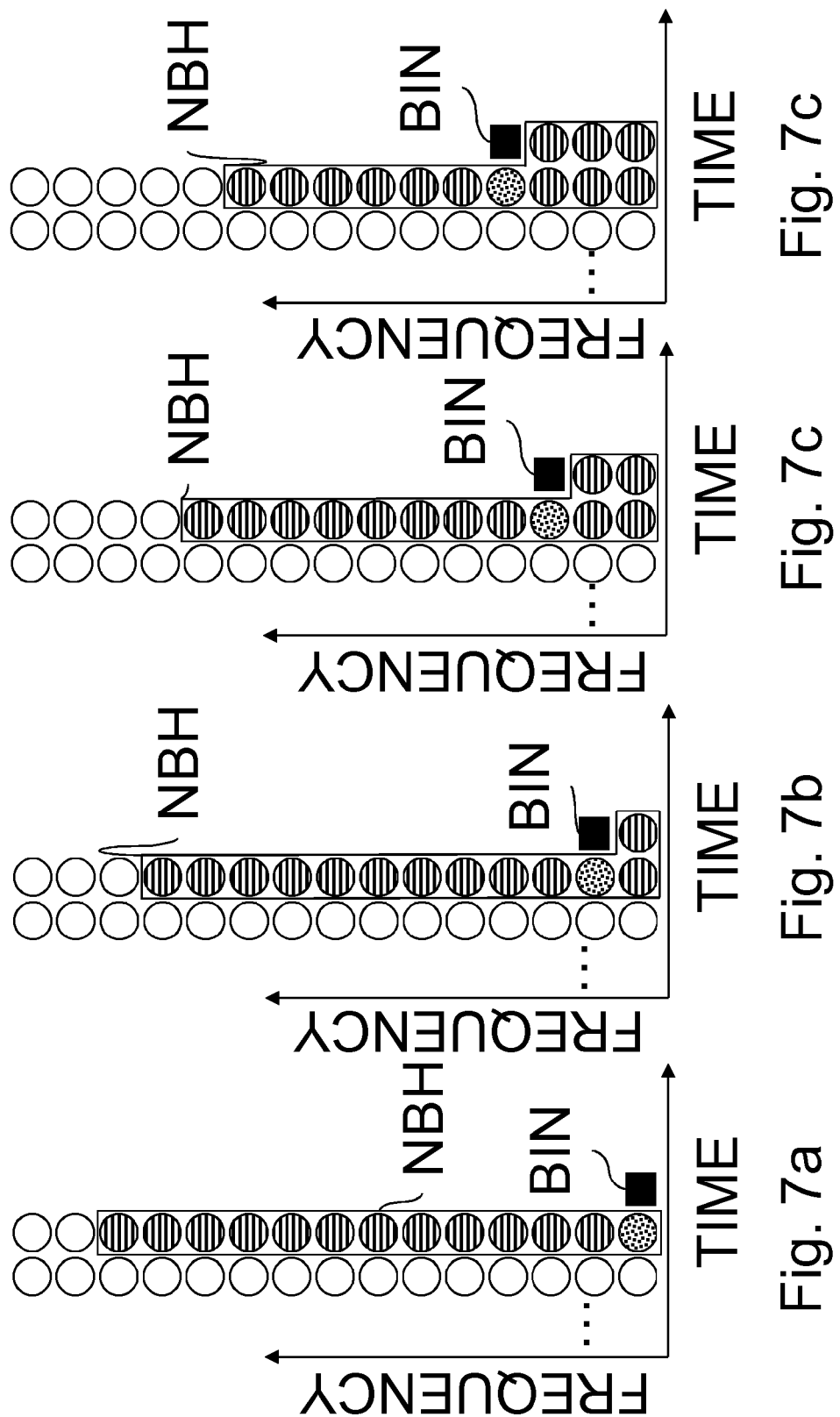

METHOD AND DEVICE FOR ARITHMETIC ENCODING OR ARITHMETIC DECODING

This application claims the benefit, under 35 U.S.C. §365 of International Application PCT/EP2010/064644, filed Oct. 1, 2010, which was published in accordance with PCT Article 21(2) on Apr. 14, 2011 in English and which claims the benefit of European patent application No. 09305961.6, filed Oct. 9, 2009.

TECHNICAL FIELD

The invention is related to arithmetic encoding and decoding of multimedia data.

BACKGROUND OF THE INVENTION

Arithmetic coding is a method for lossless compression of data. Arithmetic coding is based on a probability density function (PDF). For achieving a compression effect, the probability density function on which the coding is based has to be identical to or at least resemble—the closer the better—the actual probability density function which the data actually follows.

If arithmetic coding is based on a suitable probability density function, it may achieve significant compression resulting in at least almost optimal code. Therefore, arithmetic coding is a frequently used technique in audio, speech or video coding for encoding and decoding of coefficient sequences wherein coefficients are quantized time-frequency-transform of video pixels or audio or speech signal sample values in binary representation.

For even improving compression, arithmetic coding may be based on a set of probability density functions, wherein the probability density function used for coding a current coefficient depends on a context of said current coefficient. That is, different probability density functions may be used for coding of a same quantization value in dependency on a context in which the coefficient having said same quantization value appears. The context of a coefficient is defined by the quantization values of coefficients comprised in a neighbourhood of one or more neighbouring coefficients neighbouring the respective coefficient, e.g. a subsequence of one or more already encoded or already decoded coefficients adjacently preceding, in a sequence, the respective coefficient to-be-encoded or to-be-decoded. Each of the different possible appearances the neighbourhood may take defines a different possible context each being mapped onto an associated probability density function.

In practice, said compression improvement becomes manifest only if the neighbourhood is sufficiently large. This comes along with a combinatory explosion of the number of different possible contexts as well as a corresponding huge number of possible probability density functions or a correspondingly complex mapping.

An example of a context based arithmetic coding scheme can be found in ISO/IEC JTC1/SC29/WG11 N10215, October 2008, Busan, Korea, proposing a reference model for Unified Speech and Audio Coding (USAC). According to the proposal, 4-tupels already decoded are considered for context.

Another example of a USAC related context based arithmetic coding can be found in ISO/IEC JTC1/SC29/WG11 N10847, July 2009, London, UK.

For complexity reduction in high order conditional entropy encoding, U.S. Pat. No. 5,298,896 proposes non-uniform quantization of conditioning symbols.

SUMMARY OF THE INVENTION

Corresponding to the tremendous number of contexts to-be-handled there are a tremendous number of probability density functions which need to be stored, retrieved, and handled or at least a correspondingly complex mapping from contexts to probability density functions. This increases at least one of encoding/decoding latency and memory capacity requirements. There is a need in the art for an alternative solution allowing to achieving compression similarly well while decreasing at least one of encoding/decoding latency and memory capacity requirements.

For addressing this need the invention proposes an encoding method which comprises the features of claim 1, a decoding method which comprises the features of claim 2, a device for arithmetic encoding comprising the features of claim 13, a device for arithmetic decoding comprising the features of claim 14, and a storage medium according to claim 15.

The features of further proposed embodiments are specified in the dependent claims.

Said method for arithmetic encoding, or decoding, respectively, uses preceding spectral coefficients for arithmetic encoding or decoding, respectively, of a current spectral coefficient, wherein said preceding spectral coefficients are already encoded, or decoded, respectively. Both, said preceding spectral coefficients and said current spectral coefficient, are comprised in one or more quantized spectra resulting from quantizing time-frequency-transform of video, audio or speech signal sample values. Said method further comprises processing the preceding spectral coefficients, using the processed preceding spectral coefficients for determining a context class being one of at least two different context classes, using the determined context class and a mapping from the at least two different context classes to at least two different probability density functions for determining the probability density function, and arithmetic encoding, or decoding, respectively, the current spectral coefficient based on the determined probability density function. It is a feature of the method that processing the preceding spectral coefficients comprises non-uniformly quantizing absolutes of the preceding spectral coefficients.

The use of context classes as alternative to contexts for determining the probability density function allows for grouping two or more different contexts which result into different but very similar probability density functions into a single context class being mapped onto a single probability density function. The grouping is achieved by using non-uniformly quantized absolutes of preceding spectral coefficients for determining the context class.

For instance, there is an embodiment in which processing the preceding spectral coefficients comprises determining a sum of quantized absolutes of the preceding spectral coefficients for use in determining the context class. Similarly, there is a corresponding embodiment of the device for arithmetic encoding as well as a corresponding embodiment of the device for arithmetic decoding in which the processing means are adapted for determining a sum of quantized absolutes of the preceding spectral coefficients for use in determination of the context class.

In further embodiments of the devices, the processing means are adapted such that processing the preceding spectral coefficients further comprises a first quantization in which the absolutes of the preceding spectral coefficients are quantized according a first quantization scheme, a variance determination in which variance of the absolutes of the preceding spectral coefficients quantized according the first quantization scheme is determined, usage of the determined variance for selection of one of at least two different non-linear second quantization schemes, and a second quantization in which the absolutes of the preceding spectral coefficients quantized according the first quantization scheme are further quantized according to the selected non-linear second quantization scheme. Further embodiments of the methods comprise corresponding steps.

Variance determination may comprise determination of a sum of the absolutes of the preceding spectral coefficients quantized according the first quantization scheme and comparison of the determined sum with at least one threshold.

In further embodiments, the processing means of each of the devices may be adapted such that processing either results in a first outcome or at least a different second outcome. Then, determination of the context class further comprises determination of a number of those preceding spectral coefficients for which processing resulted in the first outcome, and usage of the determined number for determination of the context class.

Each of the devices may comprise means for receiving at least one of a mode switching signal and a reset signal wherein devices are adapted for using the at least one received signal for controlling the determination of the context class.

The at least two different probability density functions may be determined beforehand using a representative set of data for determining the at least two different probability density functions and the mapping may be realized using a look-up table or a hash table.

BRIEF DESCRIPTION OF THE DRAWINGS

Exemplary embodiments of the invention are illustrated in the drawings and are explained in more detail in the following description. The exemplary embodiments are explained only for elucidating the invention, but not limiting the invention's scope and spirit defined in the claims.

In the figures.

EXEMPLARY EMBODIMENTS OF THE INVENTION

The invention may be realized on any electronic device comprising a processing device correspondingly adapted. For instance, the device for arithmetic decoding may be realized in a television, a mobile phone, or a personal computer, an mp3-player, a navigation system or a car audio system. The device for arithmetic encoding may be realized in a mobile phone, a personal computer, an active car navigation system, a digital still camera, a digital video camera or a Dictaphone, to name a few.

The exemplary embodiments described in the following are related to encoding and decoding of quantized spectral bins resulting from quantization of time-frequency transform of multimedia samples.

The invention is based on the way the already transmitted quantized spectral bins, e.g. preceding quantized spectral bins preceding a current quantized spectral bin BIN in a sequence, are used to determine the probability density function PDF to be used for arithmetic encoding and decoding, respectively, of the current quantized spectral bin BIN.

The described exemplary embodiments of the methods and devices for arithmetic encoding or arithmetic decoding comprise several steps or means, respectively, for non-uniform quantization. All steps or means, respectively, together offer the highest coding efficiency, but each step or means, respectively, alone already realizes the inventive concept and provides advantages regarding encoding/decoding latency and/or memory requirements. Therefore, the detailed description shall be construed as describing exemplary embodiments realizing only one of the steps or means, respectively, described as well as describing exemplary embodiments realizing combinations of two or more of the steps or means described.

A first step which may but need not to be comprised in an exemplary embodiment of the method is a switching step in which it is decided which general transform mode shall be used. For instance, in USAC Noiseless Coding Scheme the general transform mode may be either Frequency Domain (FD) mode or weighted Linear Prediction Transform (wLPT) mode. Each general mode might use a different neighbourhood, i.e. a different selection of already encoded or decoded, respectively, spectral bins for the determination of the PDF.

After that, the context of a current spectral bin BIN may be determined in module context generation COCL. From the determined context, a context class is determined by classifying the context wherein, prior to classification, the context is processed by preferably but not necessarily non-uniform quantization NUQ1 of the spectral bins of the context. Classification may comprise estimating a variance VES of the context and comparing the variance with at least one threshold. Or, the variance estimate is determined directly from the context. The variance estimate is then used for controlling a further quantization NUQ2 which is preferably but not necessarily non-linear.

Figure 1:
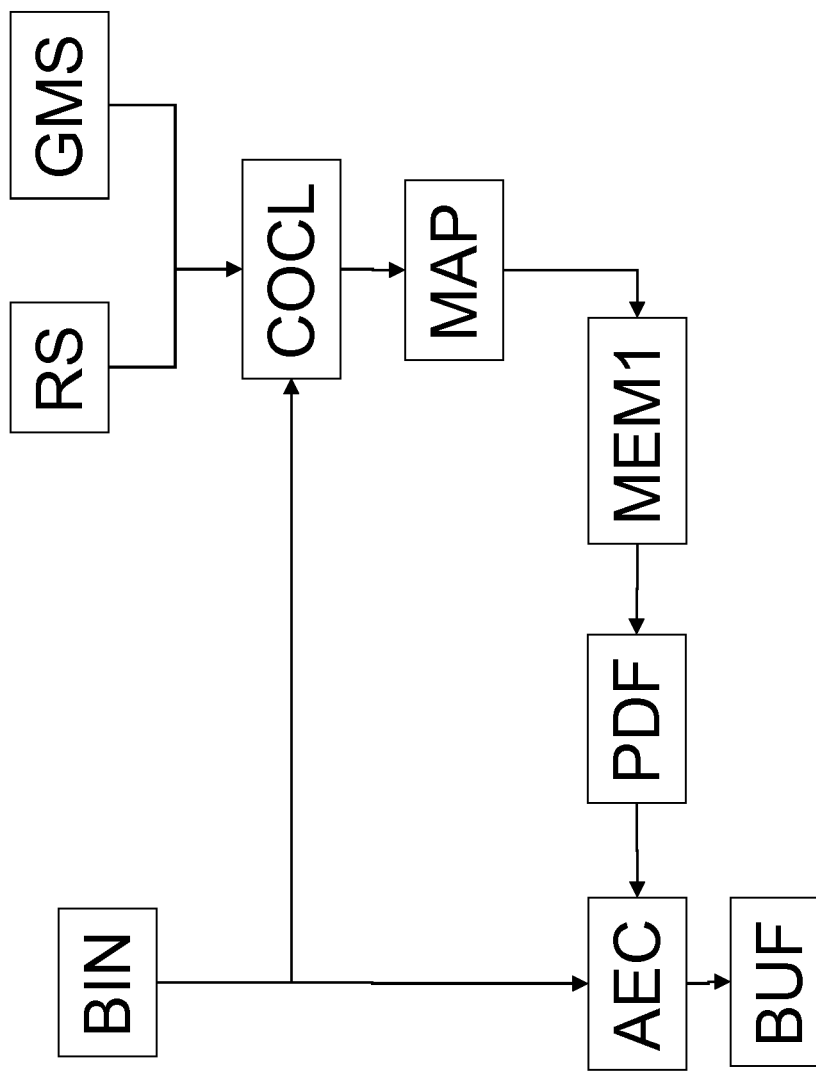
FIG. 1 exemplarily depicts an embodiment of the inventive encoder.

In the encoding process exemplarily depicted in FIG. 1, a suited probability Density Function (PDF) is determined to encode the current quantized spectral bin BIN. For this purpose only information can be used that is also already known at the decoder side. That is, only preceding encoded or decoded quantized spectral bins can be used. This is done in context classifier block COCL. There, selected preceding spectral bins define a neighbourhood NBH which is used to determine the actual context class. The context class may be symbolized by a context class number. The context class number is used to retrieve the corresponding PDF from a PDF-memory MEM1 via a mapping MAP, e.g. via a table look-up or a hash table. The determination of the context class may depend on a general mode switch GMS which allows to use different neighbourhoods in dependence on the selected mode. As mentioned above, for USAC there may be two general modes (FD mode and wLPT mode). If a general mode switch GMS is realized at the encoder side, a mode change signal or a current general signal has to be comprised in the bitstream, so that it is also known in the decoder. For instance, in the reference model for Unified Speech and Audio Coding (USAC) proposed by ISO/IEC JTC1/SC29/WG11 N10847, July 2009, London, UK there are WD table 4.4 core_mode and table 4.5 core_mode0/1 proposed for transmission of the general mode.

After determination of a suitable PDF for encoding of the current quantized spectral bin BIN by arithmetic encoder AEC, the current quantized spectral bin BIN is fed to neighbourhood memory MEM2, i.e. the current bin BIN becomes a preceding bin. The preceding spectral bins comprised in neighbourhood memory MEM2 may be used by block COCL for coding the next spectral bin BIN. During, before or after memorizing the current spectral bin BIN, said current bin BIN is arithmetic encoded by arithmetic encoder AEC. The output of arithmetic encoding AEC is stored in bit buffer BUF or is written in the bitstream directly.

The bitstream or the content of buffer BUF may be transmitted or broadcasted via cable or satellite, for instance. Or, the arithmetic encoded spectral bins may be written on a storage medium like DVD, hard disc, blue-ray disk or the like. PDF-memory MEM1 and neighbourhood memory MEM2 may be realized in a single physical memory.

Reset switch RS may allow for restarting encoding or decoding from time to time at dedicated frames at which the encoding and decoding may be started without knowledge of the preceding spectra, the dedicated frames being known as decoding entry points. If a rest switch RS is realized at the encoder side, a reset signal has to be comprised in the bitstream, so that it is also known in the decoder. For instance, in the reference model for Unified Speech and Audio Coding (USAC) proposed by ISO/IEC JTC1/SC29/WG11 N10847, July 2009, London, UK there is a arith_reset_flag in WD table 4.10 and table 4.14.

Figure 2:
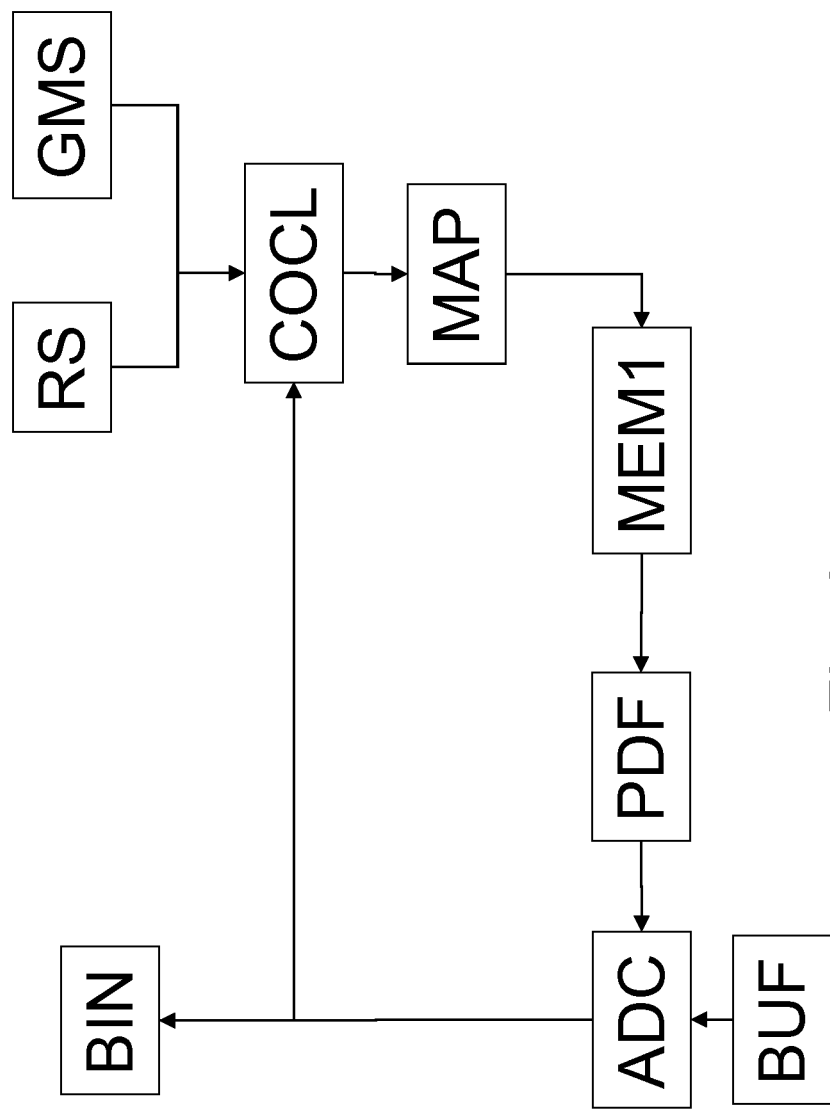
FIG. 2 exemplarily depicts an embodiment of the inventive decoder.

The corresponding neighbourhood based decoding scheme is exemplarily depicted in FIG. 2. It comprises similar blocks as the encoding scheme. The determination of the PDF to be used for the arithmetic decoding is identical with the encoding scheme to guarantee that in both, the encoder and decoder, the determined PDF is the same. The Arithmetic decoding gets the Bits form the bit buffer BUF or the bitstream directly and uses the determined PDF to decode the current quantized spectral bin BIN. Afterwards the decoded quantized spectral bin is fed to neighbourhood memory MEM2 of the Determination of context class number block COCL and may be used for decoding the next spectral bin.

Figure 3:
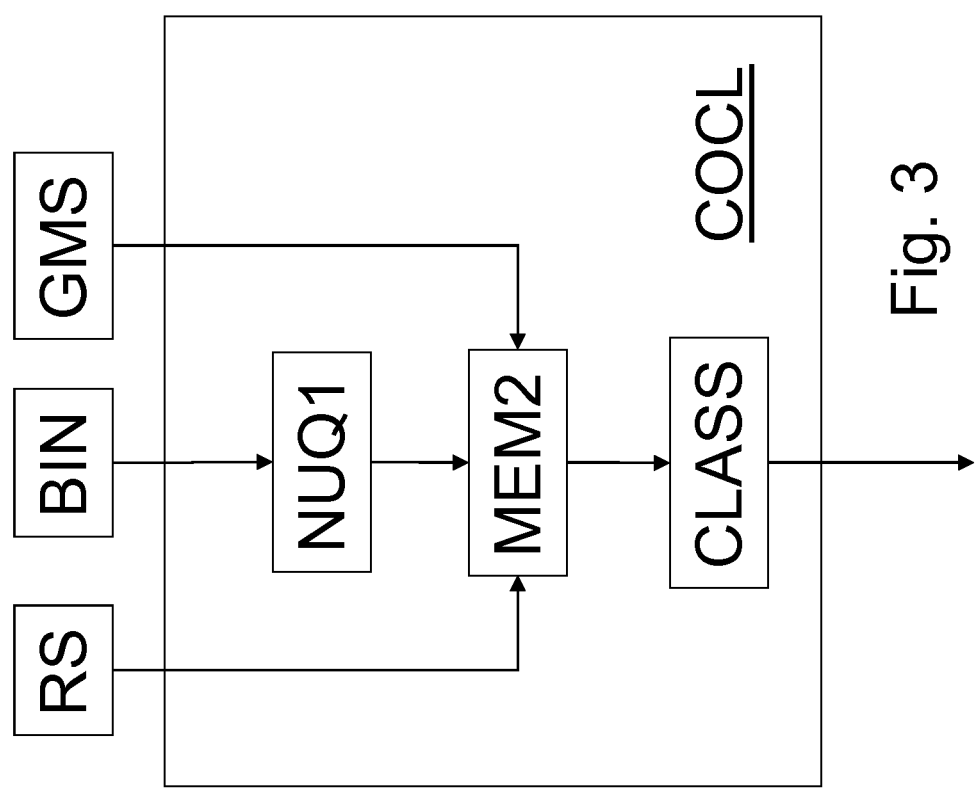
FIG. 3 exemplarily depicts a first embodiment of a context classifier for determining a context class, FIG. 4 exemplarily depicts a second embodiment of a context classifier for determining a context class, FIG. 5a exemplarily depicts a first neighbourhood of preceding spectral bins preceding a current spectral bin to-be-encoded or to-be-decoded in frequency domain mode, FIG. 5b exemplarily depicts a second neighbourhood of preceding spectral bins preceding a current spectral bin to-be-encoded or to-be-decoded in weighted linear prediction transform mode, FIG. 6a exemplarily depicts a third neighbourhood of preceding spectral bins preceding a current lowest frequency spectral bin to-be-encoded or to-be-decoded in frequency domain mode, FIG. 6b exemplarily depicts a fourth neighbourhood of preceding spectral bins preceding a current second lowest frequency spectral bin to-be-encoded or to-be-decoded in frequency domain mode, FIG. 7a exemplarily depicts a fifth neighbourhood of preceding spectral bins preceding a current lowest frequency spectral bin to-be-encoded or to-be-decoded in weighted linear prediction transform mode, FIG. 7b exemplarily depicts a sixth neighbourhood of preceding spectral bins preceding a current second lowest frequency spectral bin to-be-encoded or to-be-decoded in weighted linear prediction transform mode, FIG. 7c exemplarily depicts a seventh neighbourhood of preceding spectral bins preceding a current third lowest frequency spectral bin to-be-encoded or to-be-decoded in weighted linear prediction transform mode, FIG. 7d exemplarily depicts an eighth neighbourhood of preceding spectral bins preceding a current third lowest frequency spectral bin to-be-encoded or to-be-decoded in weighted linear prediction transform mode, FIG. 8 exemplarily depicts neighbourhoods of different spectral bins to-be-encoded or to-be-decoded, said different spectral bin being comprised in a first spectrum to-be-encoded or to-be-decoded after initiation of encoding/decoding or occurrence of a reset signal in frequency domain mode, and FIG. 9 exemplarily depicts further neighbourhoods of different spectral bins to-be-encoded or to-be-decoded in weighted linear prediction transform mode, said different spectral bin being comprised in a second spectrum to-be-encoded or to-be-decoded after initiation of encoding/decoding or occurrence of a reset signal in weighted linear prediction transform mode.

FIG. 3 exemplarily depicts a first embodiment of context classifier COCL for determining a context class in detail.

Before storing current quantized spectral bin BIN in the spectra memory MEM2 it may be non-uniformly quantized in block NUQ1. This has two advantages: first, it allows a more efficient storage of the quantized bins, which are usually 16 Bit signed integer values. Second, the number of values each quantized bin could have is reduced. This allows an enormous reduction of possible context classes in the context class determination process in block CLASS. Further more, as in the context class determination the sign of the quantized bins may be discarded, the calculation of the absolute values may be included in the non-uniform quantization block NUQ1. In Table 1 is shown exemplary non-uniform quantization as it may be performed by block NUQ1. In the example, after non-uniform quantization three different values are possible for each bin. But in general, the only constraint for the non-uniform quantization is that it reduces the number of values a bin may take.

TABLE 1

Exemplary non-uniform quantization step including the calculation of absolute values

| | Absolute value of quantized spectral bins | | | | | | | | |
|---|---|---|---|---|---|---|---|---|---|
| | 0 | 1 | 2 | 3 | 4 | 5 | 6 | 7 | 8 | >8 |
| Non-uniform quantization | 0 | 1 | | | | 2 | | | | |

The non-uniform quantized/mapped spectral bins are stored in the spectral memory MEM2. According to the selected general mode selection GMS, for the context class determination CLASS for each bin to be coded a selected neighbourhood NBH of spectral bins is selected.

Figure 5B:
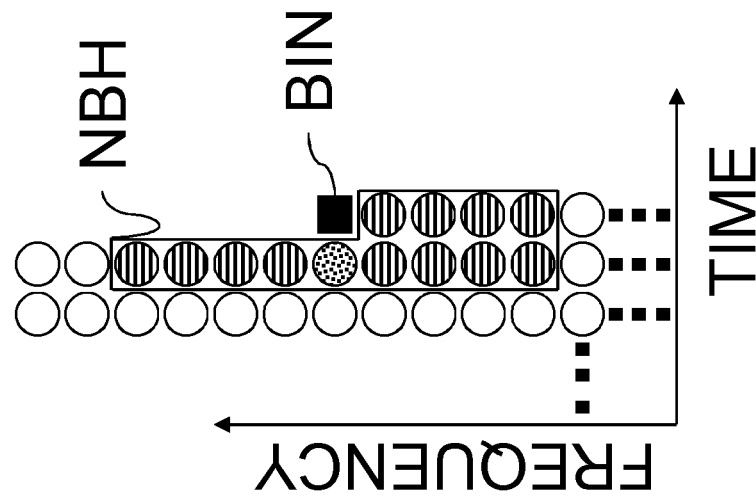
Figure 5A:
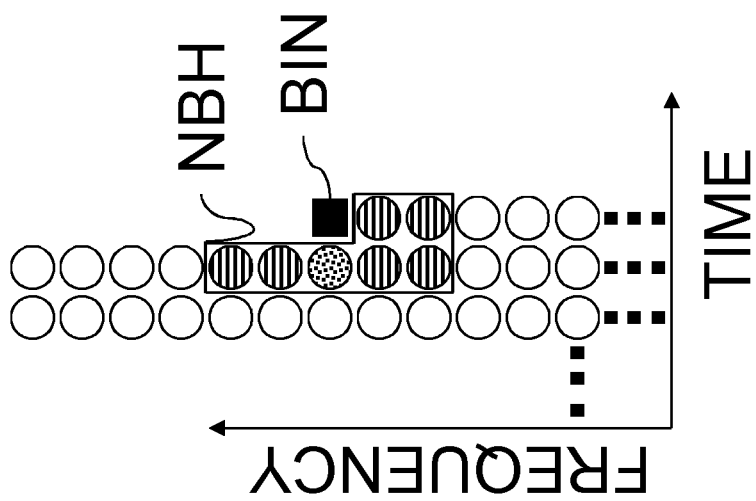

FIG. 5a exemplarily depicts a first exemplary neighbourhood NBH of a spectral bin BIN to-be-encoded or to-be-decoded.

In this example only spectral bins of the actual or current spectrum (frame) and spectral bins of one preceding spectrum (frame) define the neighbourhood NBH. It is, of course, possible to use spectral bins from more than one preceding spectrum as part of the neighbourhood, which results in a higher complexity, but may also offer a higher coding efficiency in the end. Note, from the actual spectrum only already transmitted bins may be used to define the neighbourhood NBH, as they also have to be accessible at the decoder. Here as well as in the following examples, the transmission order from low to high frequencies for the spectral bins is assumed.

The selected neighbourhood NBH is then used as input in the context class determination block COCL. In the following, first the general idea behind the context class determination and a simplified version is explained, before a special realization is described.

The general idea behind the context class determination is to allow a reliable estimation of the variance of the bin to be coded. This predicted variance, again, can be used to get an estimation of the PDF of the bin to be coded. For variance estimation it is not necessary to evaluate the sign of the bins in the neighbourhood. Therefore the sign can already be discarded in the quantization step before storage in the spectral memory MEM2. A very simple context class determination may look like as follows: the neighbourhood NBH of spectral bin BIN may look like in FIG. 5a and consists of 7 spectral bins. If exemplarily the non-uniform quantization shown in Table is used each bin can have 3 values. This results in $3^7=2187$ possible context classes.

To further reduce this number of possible context classes the relative position of each bin in the neighbourhood NBH may be discarded. Therefore, only the number of bins is counted, which have the value 0, 1 or 2, respectively, wherein, the sum of the number of 0-bins, the number of 1-bins and the number of 2-bins equals the overall number of bins in the neighbourhood, of course. In the neighbourhood NBH comprising n bins of which each may take one out of three different values there are $0.5*(n^2+3*n+2)$ context classes. For instance, in a neighbourhood of 7 bins there are 36 possible context classes and a neighbourhood of 6 bins there are 28 possible context classes.

A more complex but still quite simple context class determination takes into account that research has shown the spectral bin of the preceding spectrum at the same frequency being of special importance (the spectral bin depicted by a dotted circle in the FIGS. 5a, 5b, 6a, 6b, 7a, 7b, 7c, 8 and 9). For the other bins in the neighbourhood, those depicted as horizontally striped circles in the respective figures, the relative position is less relevant. So the bin at same frequency in the preceding spectrum is used explicitly for context class determination, whereas for the other 6 bins only the number of 0-bins, the number of 1-bins and the number of 2-bins are counted. This results in 3×28=84 possible context classes. Experiments have shown that such context classification is very efficient for the FD mode.

The context class determination may be extended by a variance estimation VES, which controls a second non-uniform quantization NUQ2. This allows a better adaptation of the context class generation COCL to a higher dynamic range of the predicted variance of the bin to be coded. The corresponding block diagram of the extended context class determination is exemplarily shown in 4.

Figure 4:
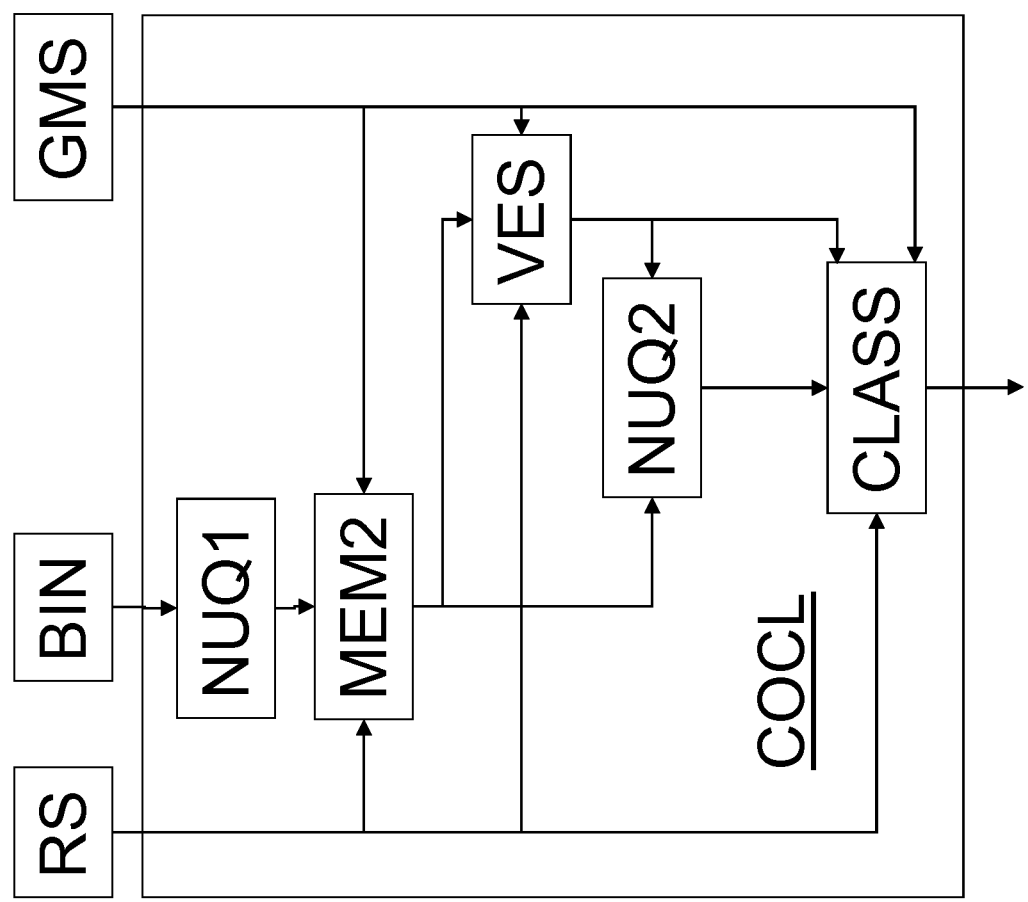

In the example shown in FIG. 4, non-uniform quantization is separated in two steps of which a preceding step provides finer quantization (block NUQ1) and a subsequent step provides coarser quantization (block NUQ2). This allows for adaptation of the quantization to e.g. the variance of the neighbourhood. The variance of the neighbourhood is estimated in the variance estimation block VES wherein the variance estimation is based on said preceding finer quantization of bins in the neighbourhood NBH in block NUQ1. The estimation of the variance need not to be precise but can be very rough. For example, it is sufficient for USAC application to decide whether the sum of the absolute values of the bins in the neighbourhood NBH after said finer quantization meets or exceeds a variance threshold or not, that is, a switch between high and low variance is sufficient.

The 2-step non-uniform quantization may look as shown in Table 2. In this example the low variance mode corresponds to the 1-step quantization shown in Table 2.

TABLE 2 depicts an exemplary 2-step non-uniform quantization; the second or subsequent step quantizes differently in dependence on whether variance has been estimated as being high or low

| | Absolute value of quantized spectral bins | | | | | | | | |
|---|---|---|---|---|---|---|---|---|---|
| | 0 | 1 | 2 | 3 | 4 | 5 | 6 | 7 | 8 | >8 |
| Finer quantization step 1 (6 values) | 0 | 1 | 2 | | 3 | | 4 | | | 5 |
| Coarser quantization step 2 (low variance) (3 values) | 0 | 1 | | | | | 2 | | | |
| Coarser quantization step 2 (high variance (3 values) | | 0 | | | | 1 | | | | 2 |

The final context class determination in block CLASS is the same as in the simplified version of FIG. 3. It is possible to use different context class determinations according to the variance mode. It is also possible to use more than two variance modes, which of course results in an increase in the number of context classes and an increase in complexity.

Figure 6B:
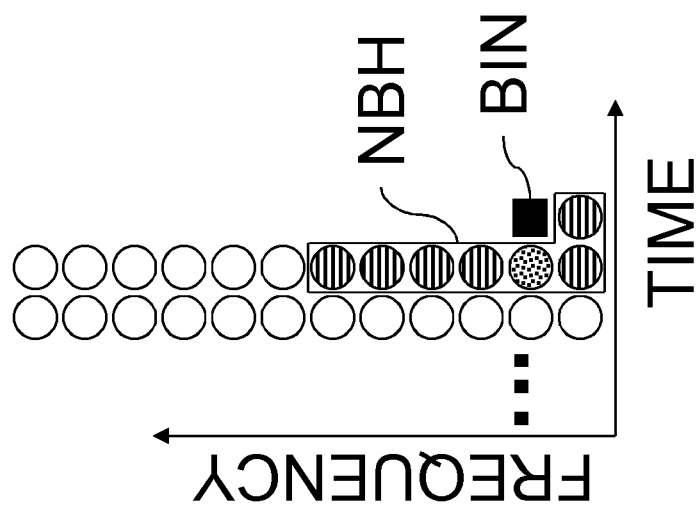
Figure 6A:
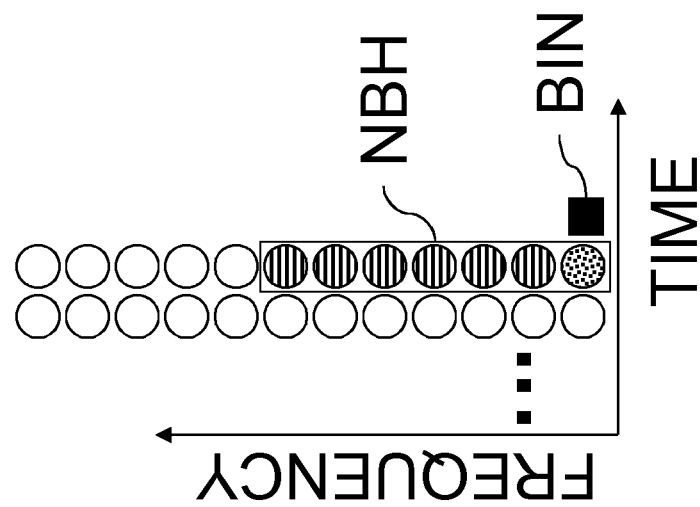

For the first bins in a spectrum a neighbourhood like it is shown in FIG. 5a or 5b is not applicable, because for the first bins none or not all lower frequency bins exist. For each of these special cases an own neighbourhood may be defined. In a further embodiment, the non-existing bins are filled with a predefined value. For the exemplary neighbourhood given in FIG. 5a the defined neighbourhoods for the first bins to be transmitted in a spectrum are shown in FIG. 6a and FIG. 6b. The idea is to expand the neighbourhood to higher frequency bins in order to allow for using the same context class determination function as for the rest of the spectrum. This means also the same context classes and at last the same PDFs can be used. This would not be possible, if the size of the neighbourhood is just reduced (of course this is also an option).

Resets usually occur before a new spectrum is coded. As already mentioned, this is necessary to allow dedicated starting points for decoding. For example, if the decoding process shall start from a certain frame/spectrum, in fact the decoding process has to start from the point of the last reset to successively decode the preceding frame until the desired starting spectrum. This means, the more resets occur, the more entry points for the decoding exits. However, the coding efficiency is smaller in a spectrum after a reset.

After a reset occurred no preceding spectrum is available for the neighbourhood definition. This means only preceding spectral bins of the actual spectrum may be used in the neighbourhood. However, the general procedure may not be changed and the same "tools" can be used. Again, the first bins have to be treated differently as already explained in the previous section.

Figure 8:
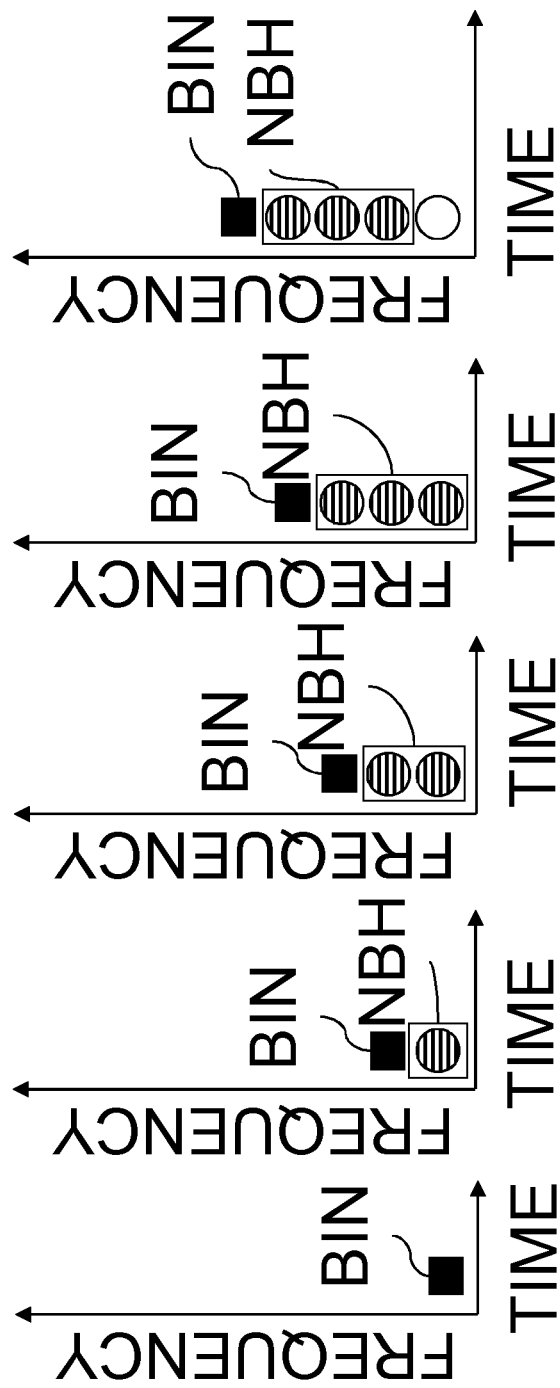

In FIG. 8 an exemplary reset neighbourhood definition is shown. This definition may be used in case of reset in the FD mode of USAC.

The number of additional context classes as shown in the example in FIG. 8 (using the quantization of Table with finally 3 possible quantized values or 6 values if values after quantization step 1 are used) are as follows: the handling for the very first bin adds 1 context class, 2nd bin adds 6 (value after quantization step 1 is used), 3rd bin adds 6 and 4th bin adds 10 context classes. If additionally consider two (low and high) variance modes this number of context classes is almost doubled (only for the first bin, where no information is available and for the second bin, where the value for the bin after quantization step 1 is used are not doubled).

This results in this example in 1+6+2×6+2×10=39 additional context classes for the handling of the resets.

Mapping block MAP takes the context classification determined by block COCL, e.g. a determined context class number, and selects the corresponding PDF from PDF-memory MEM1. In this step it is possible to further reduce the amount of necessary memory size, by using a single PDF for more than one context class. That is, context classes which have a similar PDF may use a joint PDF. These PDFs may be predefined in a training phase using a sufficiently large representative set of data. This training may include an optimization phase, where context classes corresponding to similar PDFs are identified and the corresponding PDFs are merged. Depending on the statistics of the data this can result in a rather small number of PDFs which have to be stored in the memory. In an exemplary experiment version for USAC a mapping from 822 context classes to 64 PDFs was successfully applied.

The realization of this mapping function MAP may be a simple table look-up, if the number of context classes is not too large. If the number gets larger a hash table search may be applied for efficiency reasons.

As stated above, general mode switch GMS allows for switching between frequency domain mode (FD) and weighted linear prediction transform mode (wLPT). In dependency on the mode, different neighbourhoods may be used. The exemplary neighbourhoods depicted in FIG. 5a, FIGS. 6a and 6b and FIG. 8 has been shown in experiments as sufficiently large for FD mode. But for wLPT mode, larger neighbourhoods as exemplarily depicted in FIG. 5b, FIGS. 7a, 7b and 7c and FIG. 9 has been found to be advantageous.

Figure 9:
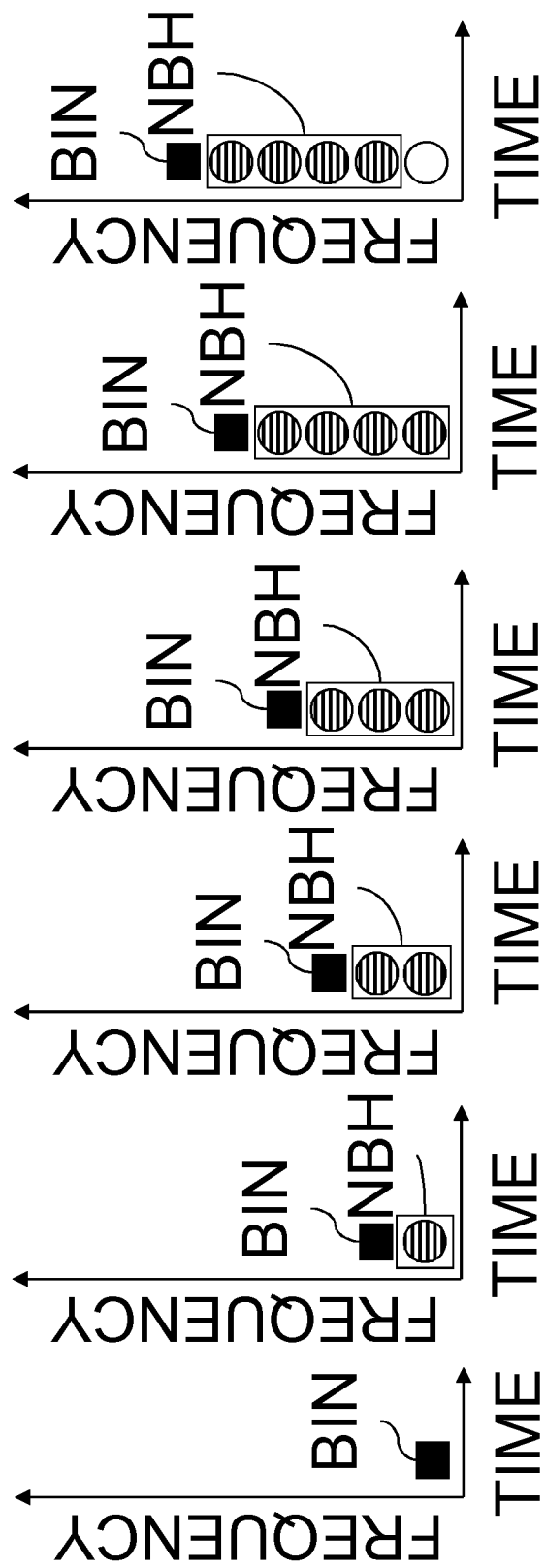

That is, exemplary reset handling in wLPT mode is depicted in FIG. 9. Exemplary neighbourhoods in wLPT mode for the lowest, the second lowest, the third lowest and the fourth lowest bin in a spectrum are depicted in FIGS. 7a, 7b, 7c and 7d, respectively. And, an exemplary neighbourhood in wLPT mode for all other bins in a spectrum is depicted in FIG. 5b.

The number of context classes resulting from the exemplary neighbourhood depicted in FIG. 5b is 3×91=273 context classes. The factor 3 results from the special handling of the one bin at the same frequency as the one currently to-be-encoded or currently to-be-decoded. According to the formula given above, there are 0.5*((12*12)+3*12+2)=91 combinations of number of bins with value 2, 1 or 0 for the remaining 12 bins in the neighbourhood. In an embodiment which differentiates context classes in dependency on whether variance of the neighbourhood meets or exceeds a threshold, the 273 context classes are doubled.

An exemplary reset handling as shown in FIG. 9 may also add a number of context classes.

In a tested exemplary embodiment which yielded good results in experiments, there are 822 possible context classes, which are broken down in the following Table 1.

TABLE 1

Broken down possible context classes of the MPEG USAC CE proposal

| Mode | Low variance mode | High variance mode |
|---|---|---|
| FD mode | 84 | 84 |
| FD mode after reset | | 39 |

TABLE 1-continued

Broken down possible context classes of the MPEG USAC CE proposal

| Mode | Low variance mode | High variance mode |
|---|---|---|
| wLPT mode | 273 | 273 |
| wLPT mode after reset | | 69 |

In a tested exemplary embodiment, these 822 possible context classes are mapped onto 64 PDFs. The mapping is determined in a training phase, as described above.

The resulting 64 PDFs have to be stored in ROM tables e.g. in 16 Bit accuracy for a fixpoint arithmetic coder. Here another advantage of the proposed scheme is revealed: in the current working draft version of the USAC standardization mentioned in the background section, quadruples (vectors containing 4 spectral bins) are jointly coded with a single codeword. This results in very large codebooks even if the dynamic range of each component in the vector is very small (e.g. each component may have the values [−4, . . . , 3]→$8^4$=4096 possible different vectors). Coding of scalars, however, allows a high dynamic range for each bin with a very small codebook. The codebook used in the tested exemplary embodiment has 32 entries offering a dynamic range for the bin form −15 to +15 and an Esc-codeword (for the case, that the value of a bin lies outside this range). This means that only 64×32 16 Bit values have to stored in ROM tables.

Above, a method for arithmetic encoding of a current spectral coefficient using preceding spectral coefficients has been describe wherein said preceding spectral coefficients are already encoded and both, said preceding and current spectral coefficients, are comprised in one or more quantized spectra resulting from quantizing time-frequency-transform of video, audio or speech signal sample values. In an embodiment, said method comprises processing the preceding spectral coefficients, using the processed preceding spectral coefficients for determining a context class being one of at least two different context classes, using the determined context class and a mapping from the at least two different context classes to at least two different probability density functions for determining the probability density function, and arithmetic encoding the current spectral coefficient based on the determined probability density function wherein processing the preceding spectral coefficients comprises non-uniformly quantizing the preceding spectral coefficients.

In another exemplary embodiment, the device for arithmetic encoding of a current spectral coefficient using preceding, already encoded spectral coefficients comprises processing means, first means for determining a context class, a memory storing at least two different probability density functions, second means for retrieving the probability density, and an arithmetic encoder.

Then, the processing means are adapted for processing the preceding, already encoded spectral coefficients by non-uniformly quantizing them and said first means are adapted for using the processing result for determining the context class as being one of at least two different context classes. The memory stores at least two different probability density functions and a mapping from the at least two different context classes to the at least two different probability density functions which allows for retrieving the probability density function which corresponds to the determined context class. The second means are adapted for retrieving, from the memory, the probability density which corresponds to the determined context class, and the arithmetic encoder is adapted for arithmetic encoding of the current spectral coefficient based on the retrieved probability density function.

There is a corresponding another exemplary embodiment of the device for arithmetic decoding of a current spectral coefficient using preceding, already decoded spectral coefficients which comprises processing means, first means for determining a context class, a memory storing at least two different probability density functions, second means for retrieving the probability density, and an arithmetic decoder.

Then, the processing means are adapted for processing the preceding, already decoded spectral coefficients by non-uniformly quantizing them and said first means are adapted for using the processing result for determining the context class as being one of at least two different context classes. The memory stores at least two different probability density functions and a mapping from the at least two different context classes to the at least two different probability density functions which allows for retrieving the probability density function which corresponds to the determined context class. The second means are adapted for retrieving, from the memory, the probability density which corresponds to the determined context class, and the arithmetic decoder is adapted for arithmetic decoding of the current spectral coefficient based on the retrieved probability density function.

The invention claimed is:

1. A method for arithmetic decoding of a current spectral coefficient using preceding spectral coefficients, said preceding spectral coefficients are already decoded and both, said preceding and current spectral coefficients, are comprised in one or more quantized spectra resulting from quantizing time-frequency-transform of video, audio or speech signal sample values, said method comprising using processing means for processing the preceding spectral coefficients, using the processed preceding spectral coefficients for determining a context class being one of at least two different context classes, using the determined context class and a mapping from the at least two different context classes to at least two different probability density functions for determining the probability density function, and arithmetic decoding the current spectral coefficient based on the determined probability density function wherein processing the preceding spectral coefficients comprises non-uniformly quantizing absolutes of the preceding spectral coefficients for use in determination of the context class.

2. The method of claim 1, wherein processing the preceding spectral coefficients comprises a first quantizing step in which the absolutes of the preceding spectral coefficients are quantized according a first quantization scheme, a step of determining a variance of the absolutes of the preceding spectral coefficients quantized according the first quantization scheme, a step of using the determined variance for selecting one of at least two different nonlinear second quantization schemes, and a second quantizing step in which the absolutes of the preceding spectral coefficients quantized according the first quantization scheme are further quantized according to the selected nonlinear second quantization scheme.

3. The method of claim 2, wherein the step of determining the variance of the absolutes of the preceding spectral coefficients quantized according the first quantization scheme comprises determining a sum of the absolutes of the preceding spectral coefficients quantized according the first quantization scheme and comparing the determined sum with at least one threshold.

4. The method of claim 1, wherein processing either results in a first outcome or at least a different second outcome and determining the context class further comprises determining a number of preceding spectral coefficients being non-uniformly quantized to the first outcome, and using the determined number for determining the context class.

5. The method of claim 4, wherein one of the preceding spectral coefficients is preferred over the preceding spectral coefficients remaining, said method further comprises using the non-uniformly quantization of the preferred one among the preceding spectral coefficient for determining the context class.

6. The method of claim 5, wherein said preferred among the preceding spectral coefficients is comprised in a preceding spectrum and said current spectral coefficient is comprised in a different current spectrum, said preferred preceding and said current spectral coefficients being comprised at a same frequency in the respective spectrum.

7. The method of claim 6, wherein said different current spectrum further comprises at least one of the remaining preceding spectral coefficients at a frequency lower than said same frequency.

8. A device for arithmetic encoding of a current spectral coefficient using preceding spectral coefficients, said preceding spectral coefficients are already encoded and both, said preceding and current spectral coefficients, are comprised in one or more quantized spectra resulting from quantizing time-frequency-transform of video, audio or speech signal sample values, said device comprising processing means for processing the preceding spectral coefficients, first means for determining a context class being one of at least two different context classes, said first means being adapted for using the processed preceding spectral coefficients for determining the context class, second means for determining the probability density function, said second means being adapted for using the determined context class and a mapping from the at least two different context classes to at least two different probability density functions for determining the probability density function, and an arithmetic encoder for arithmetic encoding the current spectral coefficient based on the determined probability density function wherein the processing means are adapted for non-uniformly quantizing absolutes of the preceding spectral coefficients for use in determination of the context class.

9. A device for arithmetic decoding of a current spectral coefficient using preceding spectral coefficients, said preceding spectral coefficients are already decoded and both, said preceding and current spectral coefficients, are comprised in one or more quantized spectra resulting from quantizing time-frequency-transform of video, audio or speech signal sample values, said device comprising processing means for processing the preceding spectral coefficients, first means for determining a context class being one of at least two different context classes, said first means being adapted for using the processed preceding spectral coefficients for determining the context class, second means for determining the probability density function, said second means being adapted for using the determined context class and a mapping from the at least two different context classes to at least two different probability density functions for determining the probability density function, and an arithmetic decoder for arithmetic decoding the current spectral coefficient based on the determined probability density function wherein the processing means are adapted for non-uniformly quantizing absolutes of the preceding spectral coefficients for use in determination of the context class.

10. A method for arithmetic encoding of a current spectral coefficient using preceding spectral coefficients, said preceding spectral coefficients are already encoded and both, said preceding and current spectral coefficients, are comprised in one or more quantized spectra resulting from quantizing time-frequency-transform of video, audio or speech signal sample values, said method comprising using processing means for processing the preceding spectral coefficients, using the processed preceding spectral coefficients for determining a context class being one of at least two different context classes, using the determined context class and a mapping from the at least two different context classes to at least two different probability density functions for determining the probability density function, and arithmetic encoding the current spectral coefficient based on the determined probability density function wherein processing the preceding spectral coefficients comprises non-uniformly quantizing absolutes of the preceding spectral coefficients for use in determination of the context class.

11. The method of claim 10, wherein processing the preceding spectral coefficients comprises a first quantizing step in which the absolutes of the preceding spectral coefficients are quantized according a first quantization scheme, a step of determining a variance of the absolutes of the preceding spectral coefficients quantized according the first quantization scheme, a step of using the determined variance for selecting one of at least two different non-linear second quantization schemes, and a second quantizing step in which the absolutes of the preceding spectral coefficients quantized according the first quantization scheme are further quantized according to the selected non-linear second quantization scheme.

12. The method of claim 11, wherein the step of determining the variance of the absolutes of the preceding spectral coefficients quantized according the first quantization scheme comprises determining a sum of the absolutes of the preceding spectral coefficients quantized according the first quantization scheme and comparing the determined sum with at least one threshold.

13. The method of claim 10, wherein processing either results in a first outcome or at least a different second outcome and determining the context class further comprises determining a number of preceding spectral coefficients being non-uniformly quantized to the first outcome, and using the determined number for determining the context class.

14. The method of claim 13 wherein one of the preceding spectral coefficients is preferred over the preceding spectral coefficients remaining, said method further comprises using the non-uniformly quantization of the preferred one among the preceding spectral coefficient for determining the context class.

15. The method of claim 14, wherein said preferred among the preceding spectral coefficients is comprised in a preceding spectrum and said current spectral coefficient is comprised in a different current spectrum, said preferred preceding and said current spectral coefficients being comprised at a same frequency in the respective spectrum.

16. The method of claim 15, wherein said different current spectrum further comprises at least one of the remaining preceding spectral coefficients at a frequency lower than said same frequency.

* * * * *